(12) United States Patent
Okumura

(10) Patent No.: US 6,267,074 B1
(45) Date of Patent: Jul. 31, 2001

(54) PLASMA TREATMENT SYSTEMS

(75) Inventor: Yutaka Okumura, Kawasaki (JP)

(73) Assignee: FOI Corporation, Kawasaki (JP)

( * ) Notice: Subject to any disclaimer, the term of this patent is extended or adjusted under 35 U.S.C. 154(b) by 0 days.

(21) Appl. No.: 09/028,898

(22) Filed: Feb. 24, 1998

(30) Foreign Application Priority Data

Feb. 24, 1997 (JP) .................................................. 9-055489

(51) Int. Cl.$^7$ .................................................. C23C 16/50
(52) U.S. Cl. .......................... 118/723 MP; 118/723 ER; 156/345
(58) Field of Search .................... 118/723 MP, 723 MW, 118/723 ME, 723 MR, 723 MA, 723 AN, 723 E, 723 ER, 723 I, 723 IR; 156/345

(56) References Cited

U.S. PATENT DOCUMENTS

| 5,113,790 | * | 5/1992 | Geisler et al. ......................... 118/723 |
| 5,587,039 | * | 12/1996 | Salimian et al. ...................... 156/345 |
| 5,627,435 | * | 5/1997 | Jansen et al. ..................... 315/111.21 |
| 5,683,548 | * | 11/1997 | Hartig et al. ........................ 156/643.1 |
| 5,702,530 | * | 12/1997 | Shan ............................... 118/723 MP |
| 5,803,973 | * | 9/1998 | Szczyrbowski et al. ....... 118/723 ER |
| 5,976,259 | * | 11/1999 | Yamazaki .............................. 118/719 |

FOREIGN PATENT DOCUMENTS

| 63-80522 | | 4/1988 | (JP) . |
| 8-55699 | * | 2/1996 | (JP) . |

* cited by examiner

Primary Examiner—Stephen Kalafut
Assistant Examiner—Jonathan Crepeau
(74) Attorney, Agent, or Firm—Oblon, Spivak, McClelland, Maier & Neustadt, P.C.

(57) ABSTRACT

A plasma treatment system comprises a plasma treatment section in which a plasma treatment space is formed and a plasma producing section in which plasma producing spaces are formed, the plasma producing section being affixed to or formed as a single piece with the plasma treatment section, wherein the plasma producing spaces are located adjacent to and connected to the plasma treatment space and are formed in a dispersed or otherwise distributed fashion. The system is associated with a magnetic circuit for confining electrons within the plasma producing spaces. The system has good controllability over the ratio of plasma constituents. Furthermore, the plasma treatment space is surrounded by a movable wall member to also enhance pressure controllability.

19 Claims, 8 Drawing Sheets

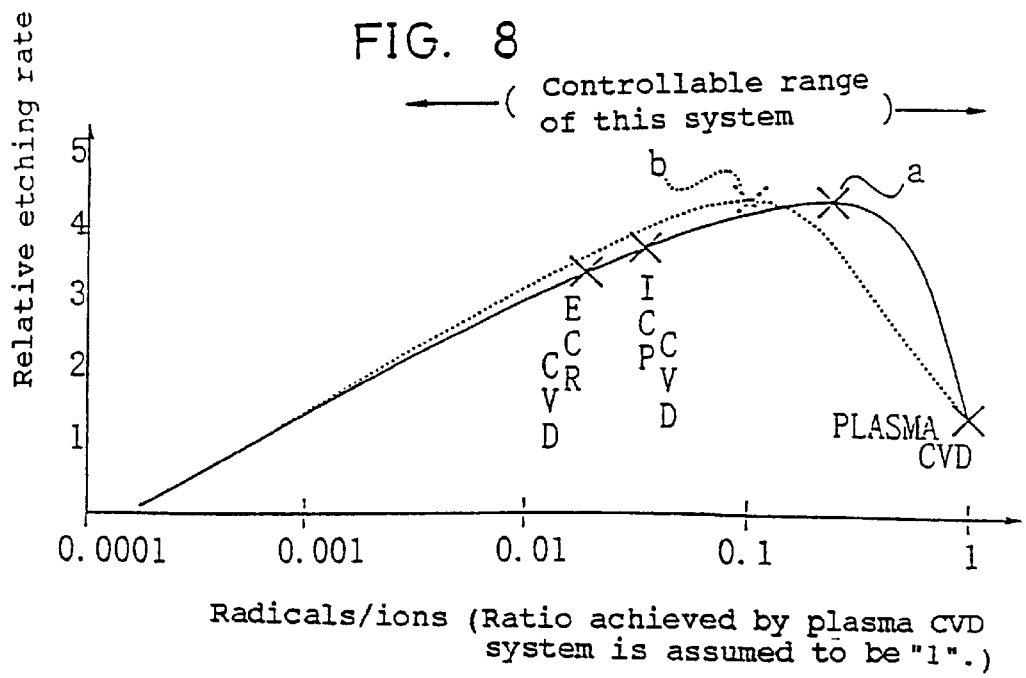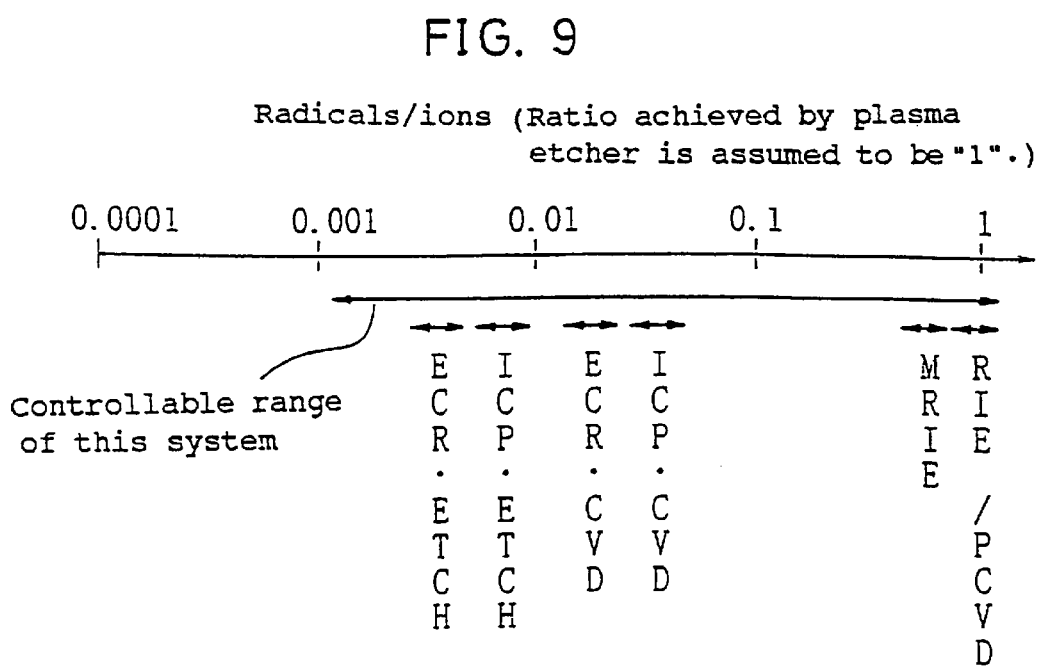

PLASMA TREATMENT SYSTEMS

BACKGROUND OF THE INVENTION

The present invention pertains to plasma treatment systems suited for effectively carrying out plasma treatment in high-precision manufacturing processes employed in producing integrated circuits (ICs) and liquid crystal displays (LCDs), for example, and, more particularly, relates to plasma treatment systems which produce a plasma by use of electronic and magnetic fields.

Conventionally known examples of plasma treatment systems used in plasma treatment, such as chemical vapor deposition (CVD), etching and ashing, include a so-called parallel plate etcher (RIE) provided with a pair of parallel plates to serve as facing electrodes, in which a plasma treatment space is created between the parallel plates and the plasma treatment performed on a substrate like a silicon wafer, as well as a parallel plate PCVD system used for film-forming operation.

Shown in FIG. 13 is a vertical sectioned constructional diagram, in which a parallel plate type plasma treatment system has a pair of parallel plates provided within a vacuum chamber, and a plasma is produced in or introduced into a plasma treatment space formed between the two parallel plates together with a specific treatment gas, for instance, is also introduced into the plasma treatment space. A plasma-assisted reaction is then produced in the plasma treatment space, whereby an etching process, for instance, is performed on a substrate surface placed within the plasma treatment space.

As an example, an etcher is now described in detail. This system comprises a vacuum chamber fitted with a vacuum chamber cover unit 3 which can be opened and closed. Since a substrate 1, which is a workpiece to be treated, has a flat platelike shape, a horizontally positioned cathode portion 12 is provided approximately in the middle of a main vacuum chamber unit 2, the cathode portion 12 having a flat-shaped top surface covered with an insulating membrane attached thereto so that the substrate 1 can be loaded on the cathode portion 12. A cylindrical lower support 12a is mounted in an upright position in the main vacuum chamber unit 2 passing through a central part of its bottom. The cathode portion 12 is fixed to the top of the lower support 12a and supported thereby. A substrate supporting structure constructed of the aforementioned elements is mounted within the vacuum chamber with its top surface formed into such a shape that allows the substrate 1 to be loaded.

Mounted approximately in the middle of the vacuum chamber cover unit 3 above the cathode portion 12 is an anode portion 11 which is hung by means of a cylindrical upper support 11a. When a high-frequency voltage is applied from an RF power supply 31 to the anode portion 11 and the cathode portion 12, which serve as facing electrodes, a plasma is produced between the anode portion 11 and the cathode portion 12 under specific vacuum pressure. If a specific treatment gas is supplied at this point, plasma treatment is performed on the substrate 1 placed on the top surface of the cathode portion 12 according to the gas state and other conditions. The anode portion 11 thus serves to form a plasma treatment space 13 between itself and the top surface of the cathode portion 12.

Formed in the main vacuum chamber unit 2 by machining is an intake opening 2a passing from the inside to the outside of the main vacuum chamber unit 2 for drawing out internal gases of the vacuum chamber in order to maintain a proper degree of vacuum. A gate valve 4a, a variable valve 4 and a vacuum pump 5 are connected to the intake opening 2a in this order. The gate valve 4a is a manually-operated valve for blocking gas flow during maintenance, for instance, and is kept in an open position during normal operation. The variable valve 4 connected between the gate valve 4a and the vacuum pump 5, such as a turbopump, is associated with a motor, for instance, which can variably change the valve opening. The motor is controlled by an electric signal so that the variable valve 4 works as a variable throttle which can remotely be controlled to regulate flow of a fluid. The vacuum pressure inside the vacuum chamber is measured by a vacuum gage 4b fitted to the vacuum chamber. When a control signal is generated by a PID control circuit 4c based on the difference between a measurement value of the vacuum gage 4b and a predefined target value, throttle setting of the variable valve 4 is varied in accordance with the control signal. The vacuum pressure within the vacuum chamber is automatically controlled by pressure control means having the vacuum gage 4b as a pressure sensor, the PID control circuit 4c as a pressure control circuit and the variable valve 4 as a pressure control mechanism as described above.

The density of plasma is insufficient in the above-described example for plasma generation, in which an electric field is applied across the parallel plates. Another known example is an arrangement in which a high-density plasma (HDP) is produced by additionally applying a magnetic field to confine the plasma. This arrangement is employed in an MRIE (magnetron reactive ion etcher), for example, in which the ratio of ion species in the composition of plasma is increased as the plasma density becomes higher. Besides the fact that the plasma tends to be unevenly distributed in this type of arrangement, the arrangement shows a tendency to cause severer damage by ions to the workpiece to be treated when the ratio of ions is increased. There exists a system devised to prevent such damage by producing a uniform magnetic field through the use of a flat-shaped coil as described in Japanese Unexamined Patent Publication No. 3-79025. The workpiece to be treated is still exposed directly to a high-density plasma being produced in this method, however, although the Publication contains no mention of charge-up problem of the workpiece to be treated caused by a plasma current and other problems arising from direct exposure to the plasma.

On the other hand, also known in the art are plasma etching systems in which an entire plasma space is divided into separate plasma spaces, that is, a plasma treatment space and a plasma producing space which are connected to each other, in order to reduce damage to a workpiece to be treated caused by ions and to prevent its direct exposure to a high-density plasma being produced, wherein the ratio of radical species is increased by reducing ion species in the composition of the plasma when the high-density plasma produced in the plasma producing space is delivered to the plasma treatment space. The systems of this type are classified into several alternatives including such systems as an ECR (electron cyclotron resonance) system using radical flow and those described in Japanese Unexamined Patent Publication No. 4-81324 in which the two spaces are separated by a great distance, such systems as an ICP (inductive-coupled plasma) system in which a high-density plasma is confined within a plasma producing space located adjacent to a plasma treatment space by means of a powerful magnetic field, and such systems as described in Japanese Unexamined Patent Publication No. 4-290428 in which a high-density plasma is confined by using circularly polarized electromagnetic waves emitted from a ring antenna although this alternative is same as the preceding alternative in that a plasma producing space is located adjacent to a plasma treatment space.

Among these conventional plasma treatment systems, however, the aforementioned ECR type of treatment system in which the two spaces are separated by a great distance does not provide so much an improvement in plasma treatment efficiency as might be expected from the ratio by which the amount of radical species is increased by reducing the ratio of ion species by more than a necessary level. This is because there exist many restrictions on the manner of mounting those mechanisms which make it possible to separate the plasma treatment space and the plasma producing space by a proper distance from each other. Previous attempts to develop a plasma treatment system based on the ECR type capable of providing good treatment efficiency at a proper plasma constituent ratio have so far been unsuccessful, because even if the ratio of radical species constituents to ion species constituents in the plasma is brought close to a level where a high plasma treatment efficiency is achieved by devising an improved method of mechanism mounting, the desirable ratio itself varies when the type or pressure of active gas, or the material of the workpiece to be treated is changed, and also because it is difficult to realize a mechanism which makes it possible to controllably vary the distance between the two spaces.

In the ICP type, ionization occurs and a plasma is produced and formed when electrons are accelerated as a result of magnetic field variations caused by variations with tine of a current flowing through a coil and their energy exceeds a level which causes a surrounding treatment gas to ionize. The high-energy electrons useful for the ionization are produced in a doughnut shape since an ionization mechanism is formed in a focused state depending on a combined magnetic field created by the coil. Since electron energy distribution approximately follows the Boltzmann distribution, electrons having energy levels equal to or higher than the ionization level cause ionization of gases within the plasma space whereas electrons having energy levels less than the ionization level produce radicals. Thus, it is not possible to arbitrarily set and control the density ratio of ions and radicals in the ICP-type plasma because formation of the ions and radicals depends on the same plasma producing means as described above. A TCP plasma (transformed-coupled plasma) system also employs roughly the same mechanism although the shape of its coil is different.

On the other hand, the approach using the circularly polarized electromagnetic waves makes it possible to avoid the use of a powerful magnetic field. In this approach, however, the plasma producing space has an expanse roughly comparable to the plasma treatment space, or an expanse at least equal to or larger than the workpiece to be treated, to ensure the uniformity of plasma distribution within the plasma treatment space, because a single ring antenna having a large diameter is employed. Thus, the two spaces are connected to each other at their adjoining surface which also has a large expanse.

If a connecting part between the two spaces has a large cross-sectional area, the amount of gases flowing in a reverse direction from the plasma treatment space into the plasma producing spaces increases. This problem is common to all such conventional plasma treatment systems that employ the separated but adjacent plasma treatment and plasma producing spaces. This also applies to the ECR type to nearly the same extent. Although the plasma treatment space and the plasma producing space of this type would appear as being separated from each other at a first glance as they are physically spaced apart unlike the TCP and ICP plasma types, they are actually not so distinctly separated as they would seemingly be expected as long as the plasma constituents are concerned, because an opening of their connecting part has a large diameter.

The aforementioned counterflow gases contain such constituents that have occurred as a result of treatment of the workpiece and should be discharged as quickly as possible although their quantities are rather small. Since these gases to be discharged are severely decomposed and ionized by the high-density plasma when they enter the plasma producing space, they could be changed in properties, forming undesirable substances which would impede proper treatment or cause contamination of the interior of the system in many cases. Even though the two spaces are seemingly divided, they are not so distinctly separated from each other as long as the plasma constituents are concerned.

Thus, it is difficult to provide high-quality treatment unless the counterflow of the undesirable gases can not be prevented even when the uniformity of plasma distribution can be maintained.

It might be possible to decrease the amount of gas passage by fitting a baffle plate at the adjoining surface through which the two spaces are connected to each other to reduce the cross-sectional area of the connecting part. Although the amount of inflow gases will decrease, the amount of outflow gases will also decrease in this case. As a consequence, gases which have once entered the plasma producing space would not easily come out and, therefore, the ratio of gases whose properties are altered by the high-density plasma would be increased. For this reason, the prevention of change in gas properties, an ultimately desired effect, is not likely to be achieved even when the arrangement as described in Japanese Unexamined Patent Publication No. 4-290428, for instance, is combined with the baffle plate, for instance.

Thus, one problem to be solved is to devise a construction of the two spaces which can effectively prevent gas flow from the plasma treatment space to the plasma producing space.

It is, however, desired to hold such prerequisites that the entire plasma space be separated into a plasma treatment space and a plasma producing space for reducing plasma damage and charge-up and the plasma producing space and the plasma treatment space be located adjacent to each other in order to achieve a proper ratio between radical species constituents and ion species constituents within the plasma.

With an increase in the physical size of substrates to be subjected to the plasma treatment, it has become common to employ a single-substrate processing method in plasma treatment systems, in which each successive substrate is treated alone at one time. Under this circumstance, the top surface of one of a pair of parallel plates that serves as a substrate supporting structure is almost entirely covered with a substrate and, therefore, it is difficult to locate an intake opening in the middle of the substrate supporting structure in a previously used fashion. For this reason, the intake opening is formed outside the location where the substrate supporting structure is mounted in an upright position in the main vacuum chamber unit. As the size of the substrate increased, the parallel plates as well as the internal volumetric capacity of the chamber and the intake opening are also becoming larger.

Notwhithstanding the increase in the substrate size, requirements for accuracy and uniformity of treatment have never been relaxed, but are becoming even more stringent.

It has then become necessary to maintain the uniformity of the state of plasma throughout the whole top surface area of the substrate to meet these requirements. If, however, the intake opening is offset from the center of a target, flow of plasma and other substances will deflect, making it difficult to maintain the uniformity of the plasma. Even when intake openings are dispersed in symmetrically arranged positions, the same problem will occur if there is a difference in the length of piping between the individual intake openings and a vacuum pump. Although it might be possible to install a baffle plate in from of each intake opening in the vacuum chamber to produce a uniform flow on the upstream side of the baffle plate (see 2b in FIG. 13) to cope with the problem, this arrangement would entail an increase of the internal volumetric capacity of the chamber and the baffle plate would work as a resistance to the flow, thus causing a loss of pressure controllability. Specifically, it would become impossible to swiftly control pressure condition of the plasma, causing increased pressure variations, and thereby making it difficult to maintain the plasma pressure at a desired setting.

On the other hand, it can be said that it is effective in increasing the plasma pressure controllability to reduce the capacity of the vacuum chamber. One specific approach would be to reduce the size of the vacuum chamber down to such a point that the inside wall surface of the chamber would scarcely come into contact with outer edges of the parallel plates (see FIG. 14). If the capacity of the vacuum chamber is reduced simply by using such forcible approach, however, there is no way but to locate the intake opening right at the side of the plasma treatment space. Thus, this approach could produce a severely deflected plasma flow, causing a significant deterioration of the uniformity of the plasma. Since there is not any spatial room for installing a baffle plate in this case, it would become difficult to install a substrate input and output mechanism, for instance, and maintenance work of the rear sides of the parallel plates, for instance, would also become difficult.

Besides the uniformity of plasma treatment, capability to cope with the tendency toward large-sized substrate is also an important prerequisite for the plasma treatment systems and, thus, it is not possible to maintain and enhance the value of these systems as manufactured products if they are barely good enough to meet only one of these requirements.

Accordingly, another problem to be solved is to devise a construction which makes it possible to control the pressure condition of the plasma, for instance, to create an even more uniform state even more swiftly, in order to meet the aforementioned contradictory requirements.

SUMMARY OF THE INVENTION

An object of the invention is to provide a plasma treatment system which has solved the aforementioned problems of the prior art.

Another object of the invention is to provide a plasma treatment system which supplies a high-quality plasma by positively increasing the capability to achieve a proper plasma constituent ratio and controllability and satisfying requirements for both ensuring the uniformity of plasma distribution and preventing the gas from flowing from a plasma treatment space into plasma producing spaces on condition that an entire plasma space is divided into the plasma treatment space and plasma producing spaces located adjacent to each other.

Still another object of the invention is to provide a plasma treatment system which has the capability to supply a uniform and high-quality plasma as well as excellent pressure controllability.

According to a first feature of the invention, a plasma treatment system comprises a plasma treatment section in which a plasma treatment space is formed and a plasma producing section in which plasma producing spaces are formed, the plasma producing section being affixed to or formed as a single piece with the plasma treatment section, wherein the plasma producing spaces are located adjacent to and connected to the plasma treatment space and are formed in a dispersed or otherwise distributed fashion.

According to a second feature of the invention, a plasma treatment system is such that a plasma treatment space is formed between a pair of parallel plates which serve as facing electrodes, wherein plasma producing spaces which are located adjacent to and connected to the plasma treatment space are formed in a dispersed or otherwise distributed fashion in one of the pair of parallel plates or in its adjoining mechanism section.

According to a third feature of the invention, a plasma treatment system is such that a plasma treatment space is formed between a pair of parallel plates which serve as facing electrodes, wherein plasma producing spaces which are located adjacent to and connected to the plasma treatment space are formed in one of the pair of parallel plates or in its adjoining mechanism section, and the plasma producing spaces are associated with a magnetic circuit, magnetic elements for creating the magnetic circuit being disposed in a region surrounded or sandwiched by the plasma producing spaces.

According to a fourth feature of the invention, a plasma treatment system is such that a plasma treatment space is formed between a pair of parallel plates which serve as facing electrodes, wherein plasma producing spaces which are located adjacent to and connected to the plasma treatment space are formed in a dispersed or otherwise distributed fashion in one of the pair of parallel plates or in its adjoining mechanism section, and the plasma producing spaces are associated with a magnetic circuit for confining electrons.

These and other objects, features and advantages of the invention will become more apparent upon reading the following detailed description in conjunction with the accompanying drawings.

BRIEF DESCRIPTION OF THE DRAWINGS

FIG. 8 is a graph showing a range within which the ratio of ions can be controlled in a plasma CVD system;

FIG. 9 is a schematic diagram showing a range within which the ratio of ions in a plasma can be controlled;

DETAILED DESCRIPTION OF THE PREFERRED EMBODIMENTS OF THE INVENTION

Figure 1:
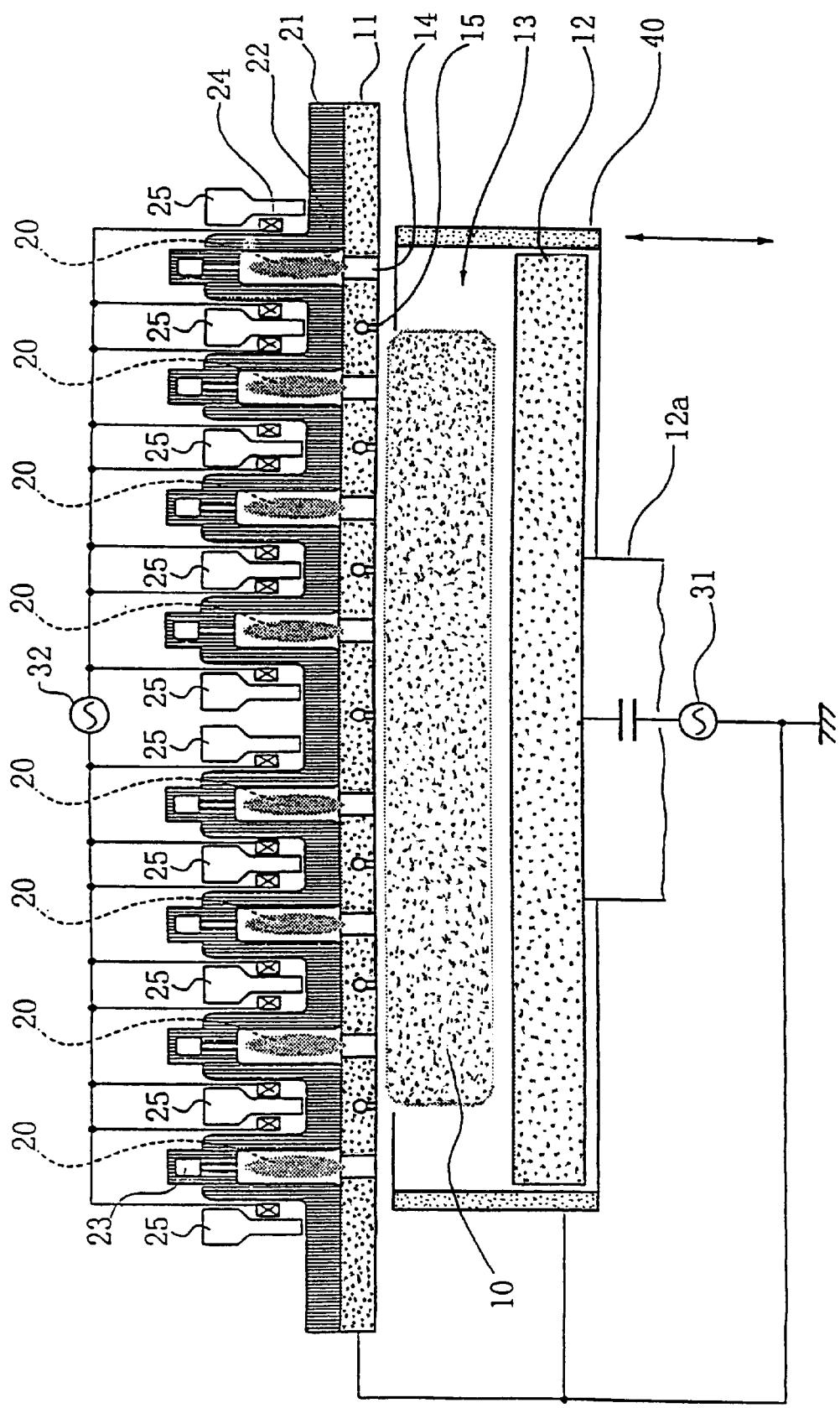
FIG. 1 is a vertical cross-sectional diagram of principal parts of a plasma etching system taken as a practical example of a plasma treatment system according to the invention.
Figure 2:
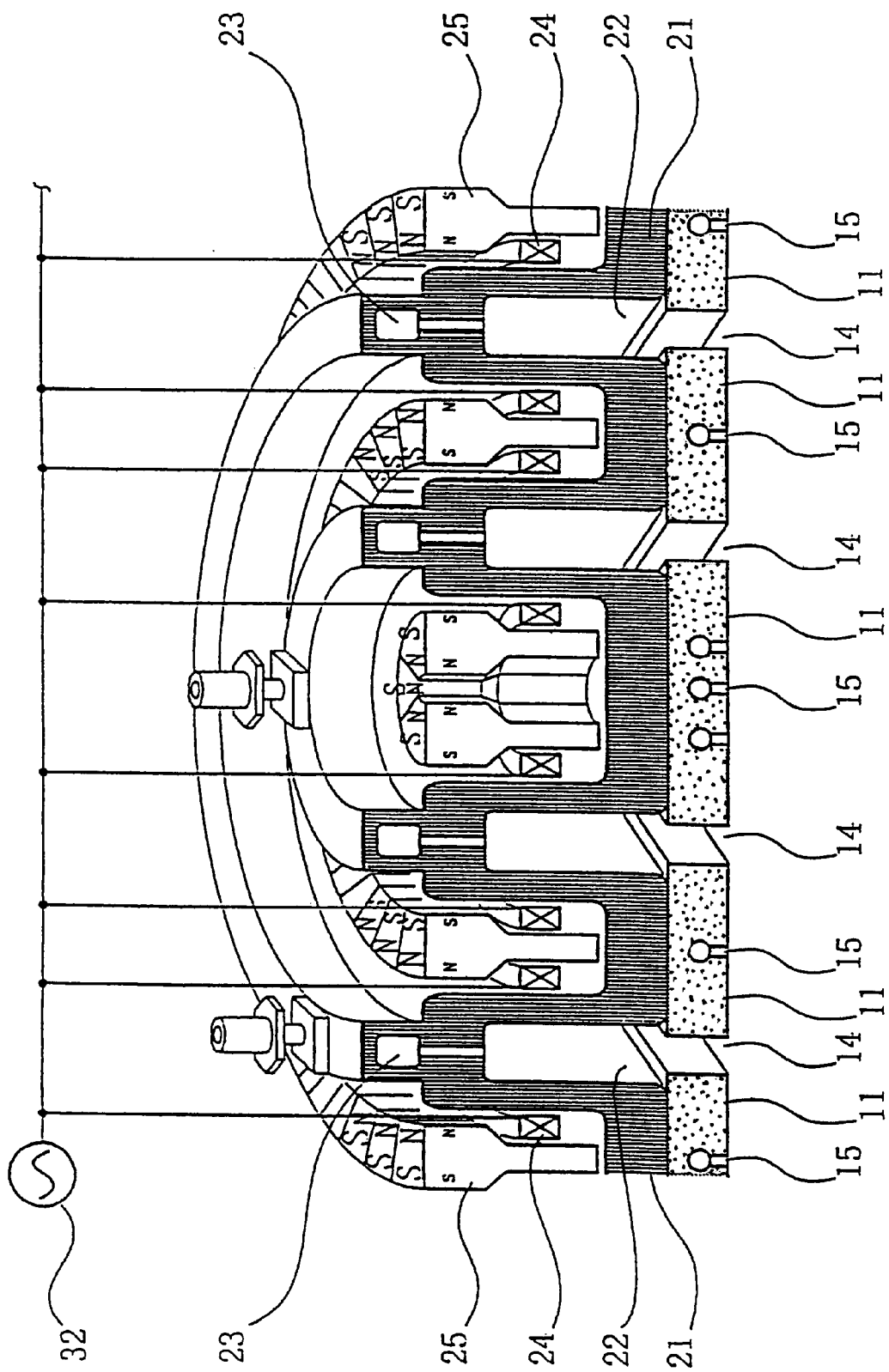
FIG. 2 is a vertical cross-sectional perspective diagram showing a structure around a plasma producing chamber of the plasma etching system.
Figure 3:
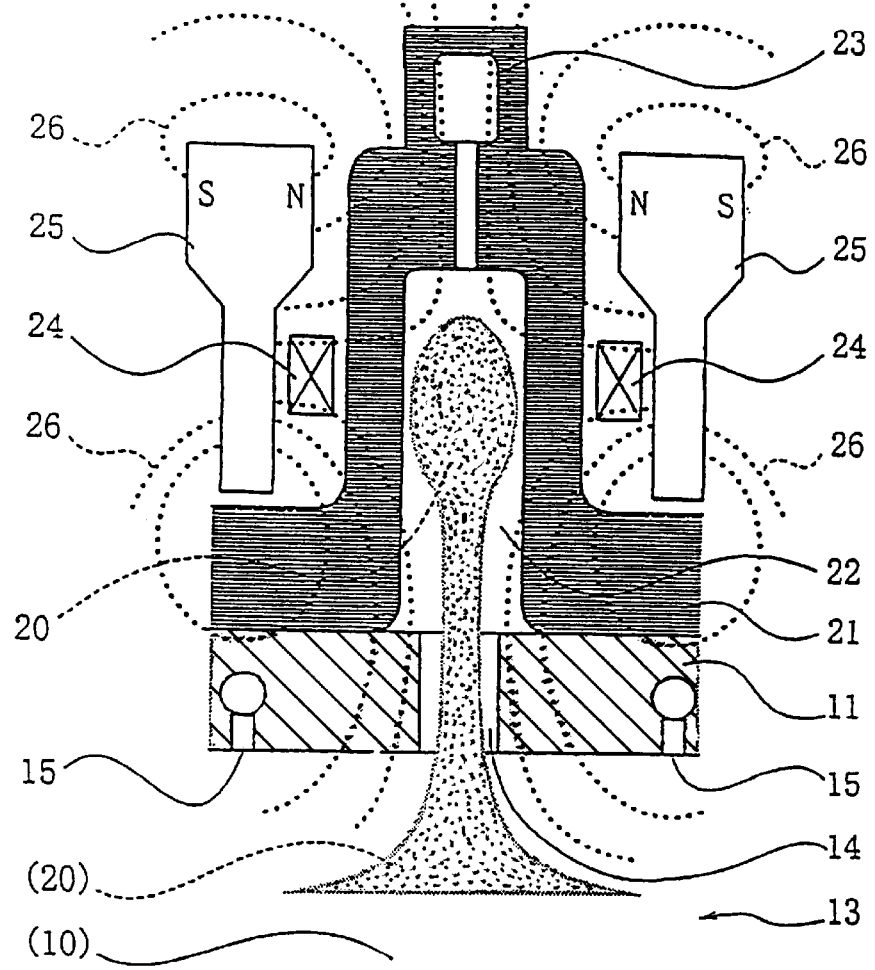
FIG. 3 is an enlarged diagram showing one of plasma producing spaces.
Figure 5:
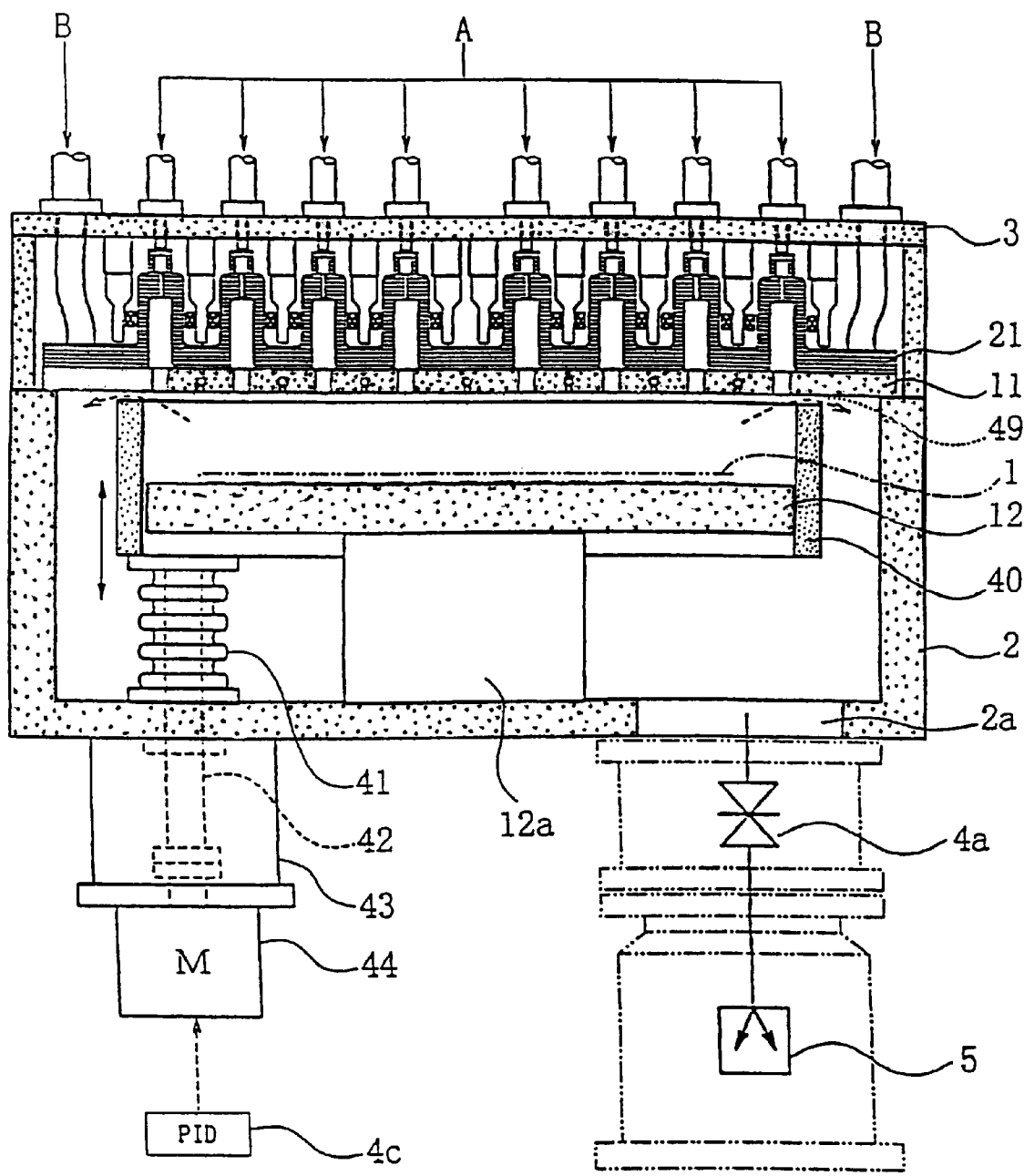
FIG. 5 is a cross-sectional diagram showing a mounting condition in a vacuum chamber.
Figure 6A:
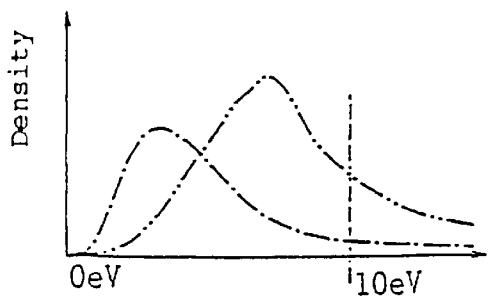
FIGS. 6A–6D are graphs showing energy distributions of electrons within plasmas.
Figure 6B:
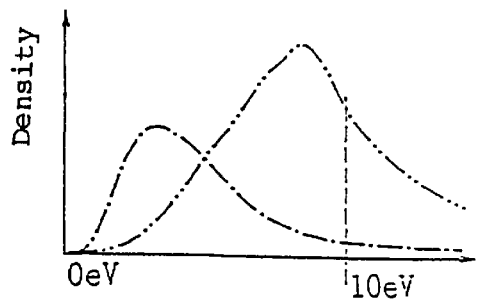
Figure 6C:
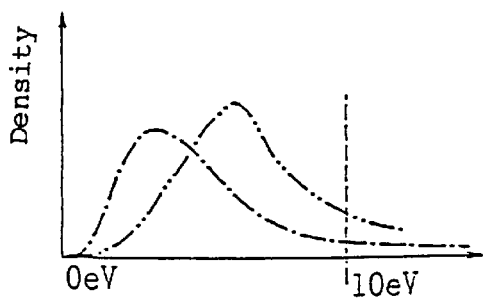
Figure 6D:
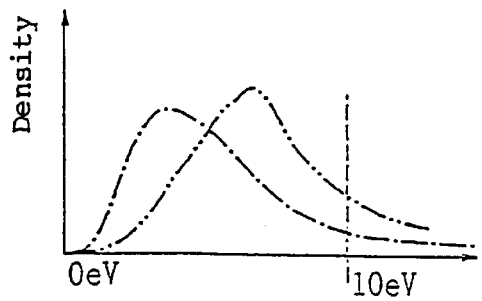

A specific construction of a plasma etching system taken as a practical example of a plasma treatment system according to the present invention is now described with reference to the drawings. FIG. 1 is a vertical cross-sectional diagram of principal parts of the system; FIG. 2 is a vertical cross-sectional perspective diagram showing a structure around a plasma producing chamber of the system; FIG. 3 is an enlarged diagram showing one of plasma producing spaces; and FIG. 5 is a cross-sectional diagram showing a mounting condition in a vacuum chamber.

This plasma etching system generally comprises a parallel plate section (plasma treatment section) for providing a plasma treatment space, an adjoining mechanism section (plasma producing section) for providing the plasma producing spaces and its associated part, as well as field application circuit portion for applying electric or magnetic fields to individual masses of plasma.

The parallel plate section includes an anode portion 11 and a cathode portion 12 which are both metallic and together form a pair of parallel plates, in which the anode portion 11 is located in an upper position while the cathode portion 12 which serves as a substrate supporting structure whose top surface is insulated for loading a substrate 1, such as a wager to be etched, is located in an lower position. A plasma treatment space 13 is formed in a region sandwiched between the anode portion 11 and the cathode portion 12. The anode portion 11 has a number of readily formed connecting holes 14 which pass through the anode portion 11, as well as treatment gas inlets 15 which serve as second gas intake channels opening to the plasma treatment space 13. In this example, the ratio of the cross-sectional area of the connecting holes 14 to the effective cross-sectional area of the plasma treatment space 13, or the first ratio, is set to 0.05. This example is so designed that a mixture of a reacting gas like silane gas and a proper amount of diluent gas is supplied as a treatment gas B.

The adjoining mechanism section, or the mechanism which adjoins one plate 11 of the pair of parallel plates, includes a plasma producing chamber 21 formed of an insulating material as a principal constituent part, and a plurality (four in the Figures) of annular grooves which constitute plasma producing spaces 22 are cut in the plasma producing chamber 21 in concentric form. Thus, the plasma producing spaces 22 are dispersed or otherwise distributed in this configuration. The plasma producing chamber 21 is firmly fixed, with an open side (underside in the Figures) of the plasma producing spaces 22 in tight contact with a top surface of the anode portion 11. When fixed, the plasma producing chamber 21 is so positioned that openings of the plasma producing spaces 22 come in alignment with the connecting holes 14 of the anode portion 11. With this arrangement, the individual plasma producing spaces 22 and the plasma treatment space 13 are made to adjoin one another and interconnect. In this example, the ratio of the cross-sectional area of the connecting holes 14 to the cross-sectional area of the plasma producing spaces 22, or the second ratio, is set to 0.5. A consequence of this is that an interface area through which each plasma producing space 22 is connected to the plasma treatment space 13 is smaller than the cross-sectional area of each plasma producing space 22 and is somewhat narrowed. It is to be noted that the value of this ratio may be arbitrarily varied unless the relationship the values of the two cross-sectional areas is not inverted.

The plasma producing chamber 21 is constructed such that plasma producing gas feeding channels 23, which serve as first gas intake channels, are formed also in annular form in the back of the individual plasma producing spaces 22, with a number of small holes or nozzles interconnecting the plasma producing gas feeding channels 23 and the plasma producing spaces 22, wherein the plasma producing gas feeding channels 23 are supplied with a plasma producing gas A composed on only a non-reactive gas constituent, such as argon, from their bottoms (upper side in the Figures), produce a high-density plasma 20, and feed it into the plasma treatment space 13 through the connecting holes 14.

Further, a surface (top surface in the Figures) of the plasma producing chamber 21 opposite to the open side of the plasma producing spaces 22 is cut away, leaving side walls which surround the plasma producing spaces 22 as well as their bottoms. Coils 24 and permanent magnet pieces 25 are then fitted in annular arrays in a manner that they sandwich both side walls of each plasma producing space 22.

Having approximately the same vertical length as the plasma producing spaces 22, the permanent magnet pieces 25 are arranged such that their magnetic poles are directed toward the plasma producing spaces 22 located at their side. The permanent magnet pieces 25 are made of small pieces in order to eliminate undesirable induced currents which would otherwise flow along the annular form. A large number of permanent magnet pieces 25 are arranged along the side walls of the plasma producing spaces 22 to form an annular magnetic circuit corresponding to the plasma producing spaces 22. Thus, magnetic elements 25 for producing the magnetic circuit, excluding the elements in the outermost array, are arranged in regions sandwiched by the plasma producing spaces 22. Magnetic force to be produced by the magnetic circuit would be sufficient if it is strong enough to just capture electrons of small mass, and such a strong magnetic force that would be sufficient to capture large-mass ions are not required.

Figure 4:
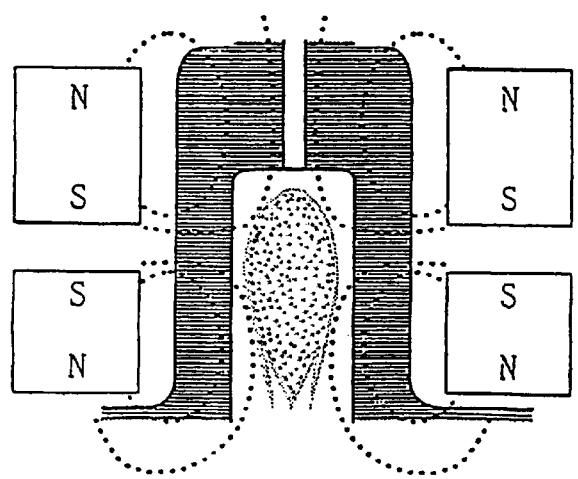
FIG. 4 is an enlarged cross-sectional diagram showing one variation of a magnetic circuit.

A cross section of the magnetic circuit (see FIG. 3) is now described in detail. Since lines of magnetic flux 26 departing from about an upper half of the vertically elongate permanent magnet pieces 25 return to the permanent magnet pieces 25 themselves, forming approximately concentric circles with their center located near an upper end of the permanent magnet pieces 25, there is formed a protruding part of magnetic flux whose peak point is located at about the upper end of the permanent magnet pieces 25. An almost identical protruding part of magnetic flux is formed around a lower end of the permanent magnet pieces 25 as well. Since the permanent magnet pieces 25 are mounted on both sides of each plasma producing space 22, there are formed four protruding parts of magnetic flux around each plasma producing space 22. Therefore, there is formed, so to speak, a basin of magnetic flux surrounded by the protruding parts of magnetic flux in each plasma producing space 22, and electrons are captured in this basin of magnetic flux. Although the foregoing discussion has described the magnetic circuit as if it were a field of potentials, it is actually a vector field and, therefore, its precise description would be so complex. Generally speaking, however, the electrons are confined in a doughnut-shaped form within each of the annular plasma producing spaces 22. It is to be noted that four protruding parts of magnetic flux surrounding each plasma producing space 22 can be created by employing an array of permanent magnet pieces whose magnetic poles are vertically aligned (see FIG. 4). Although not specifically illustrated, there may be formed five or more protruding parts of magnetic flux.

The field application circuit portion is divided into two parts: a first field application circuit formed around an RF power supply 31 and a second field application circuit formed around an RF power supply 32.

The RF power supply 31 is of a type whose output power is made variable. Its output is delivered to the cathode portion 12 through a blocking capacitor to produce an alternating electric field and to apply a bias voltage between the cathode portion 12 and the anode portion which is grounded. A power supply operating at a frequency of 500 kHz to 2 MHz is often used as the RF power supply 31. In this configuration, the first field application circuit serves to apply an electric field which will more or less contribute to the enhancement of a cold plasma 10 across the plasma treatment space 13.

The RF power supply 32 is also of a type whose output power is made variable. It drives two successive coils 24 sandwiching each plasma producing space 22 to apply an alternating magnetic field thereto. The RF power supply 32 has a high output power rating and its operating frequency is set between 13 MHz and 100 MHz in most cases. In this configuration, the second field application circuit serves to apply a magnetic field which will more or less contribute to the production and enhancement of the high-density plasma 20 to the plasma producing spaces 22.

Figure 13:
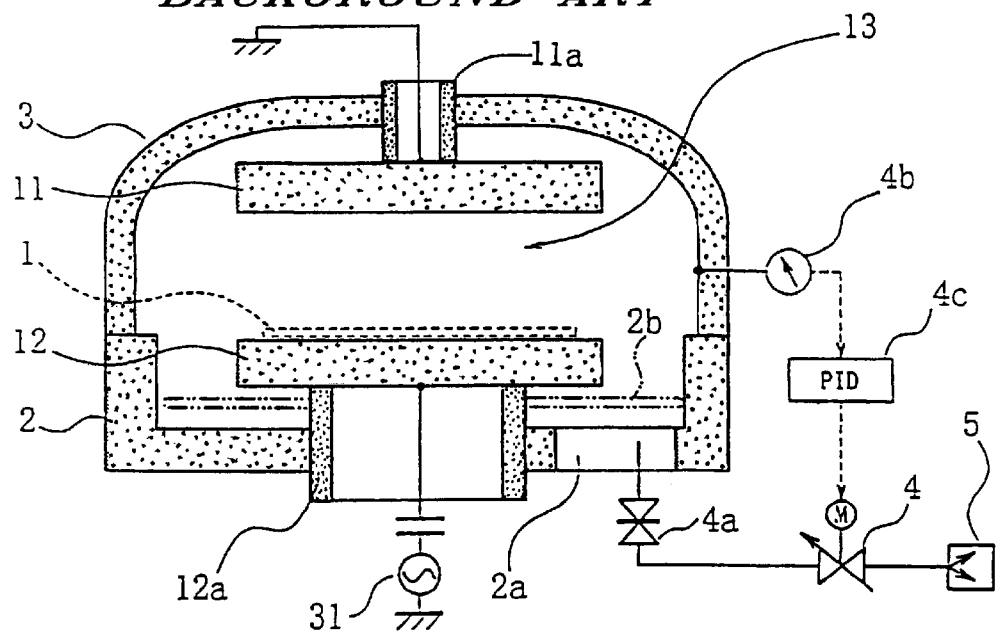
FIG. 13 is a cross-sectional diagram showing a conventional plasma treatment system.
Figure 14:
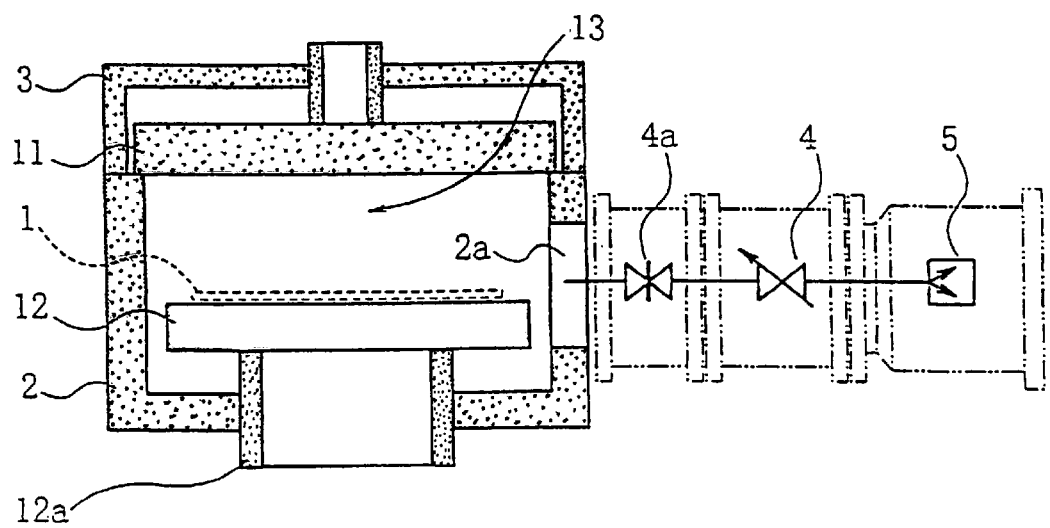
FIG. 14 is a cross-sectional diagram showing a condition in which a chamber of the conventional plasma treatment system is reduced in size.

Configuration of pressure control means is such that the variable valve 4 of the conventional system (see FIG. 13) is eliminated an, instead, a movable wall member 40 and a wall member drive mechanism 41-44 for vertically moving the movable wall member 40 are provided (see FIG. 5).

The movable wall member 40 is formed of a metallic cylindrical body with its inside diameter slightly larger than the outside diameter of the cathode portion 12. The movable wall member 40 is fitted over the cathode portion 12 in a manner that the cathode portion 12 can be slowly moved up and down. The movable wall member 40 is disposed such that an approximately uniform clearance is formed all around its upper end when it comes into close proximity with the anode portion 11. The movable wall member 40 is formed to such a length that its upper part blocks all around side faces of the plasma treatment space 13 and its lower part reaches a point where the movable wall member 40 would not come off the cathode portion 12. Thus, the movable wall member 40 has such a shape that closes off an opening part of the plasma treatment space 13 defined with reference to the pair of parallel plates 11-12 disposed within a vacuum chamber 2-3. To avoid undesirable charge-up, the movable wall member 40 is grounded, for instance.

The wall member drive mechanism is constructed such that a bellows 41 having airtightness and a capability to extend and contract interconnect the bottom surface of a main vacuum chamber unit 2 and the movable wall member 40 at a position outside an intake opening 2a, a ball screw 42 is vertically passed through the bellows 41, and an upper end of the ball screw 42 is connected to the movable wall member 40 to support it in a manner that the movable wall member 40 can move up and down. Further, a lower end of the ball screw 42 is connected to a rotary shaft of a motor 44 which is fixed to the main vacuum chamber unit 2 by a support 43. When the motor 44 runs, the ball screw 42 is driven to extend and retract and, as a consequence, the movable wall member 40 is caused to move upward or downward between its uppermost point where the movable wall member 40 comes nearly in contact with the anode portion 11 and its lowermost point where the movable wall member 40 is located below the top surface of the cathode portion 12. The wall member drive mechanism 41-44 thus constructed serves to move the movable wall member 40 up and down all the way between its upper position where the movable wall member 40 covers the opening part of the plasma treatment space 13 and its lower position where the movable wall member 40 uncovers the opening part of the plasma treatment space 13.

Although not illustrated, a vacuum gage 4b is fitted to the movable wall member 40 such that it can directly detect the pressure within the plasma treatment space 13 and a detection signal can be taken out through an internal cavity of the bellows 41 without breaking vacuum. The number of rotations and rotating speed of the motor 44 are controlled by a PID control circuit 4c as it receives the detection signal. In this construction, the plasma etching system is provided with the pressure control means for controlling the amount of upward and downward movements of the movable wall member 40 which is driven by the wall member drive mechanism 41-44 in accordance with the pressure within the plasma treatment space 13.

Figure 7:
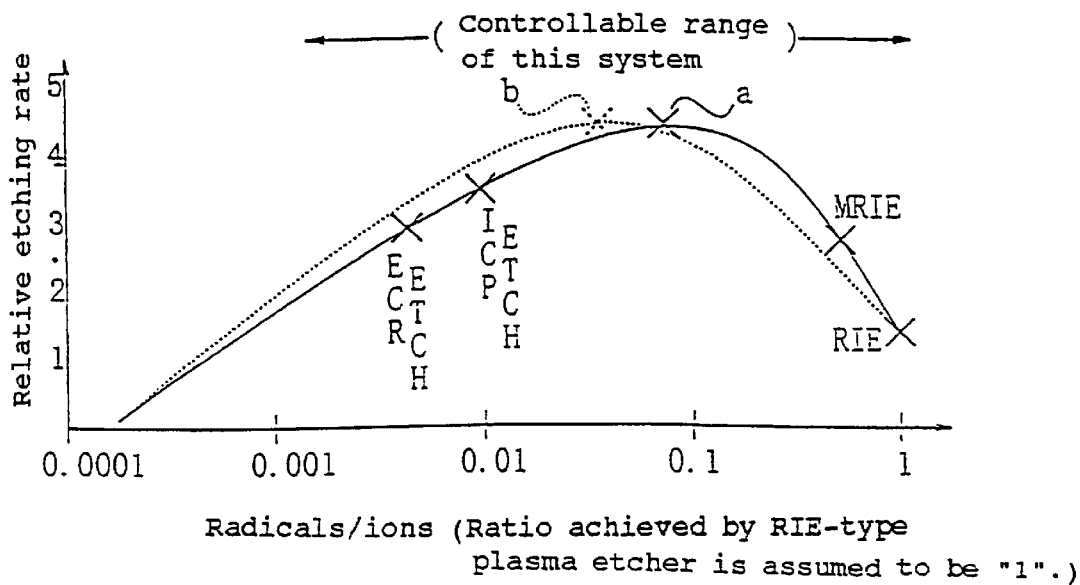
FIG. 7 is a graph showing a range within which the ration of ions can be controlled in a plasma etcher.

Modes of operation and working of the plasma etching system of this practical example are described with reference to the drawings. FIG. 5 is a cross-sectional diagram showing the aforementioned condition is which principal parts are mounted to the vacuum chamber; FIGS. 6A–6D are graphs showing energy distributions of electrons within plasmas; and FIG. 7 is a diagram showing a range within which the ratio of ions in a plasma can be controlled.

Before operating the plasma etching system, its cathode portion 12 is mounted in the middle of the boxlike main vacuum chamber unit 2 which is open at the top with a lower support 12a placed beneath the cathode portion 12. The main vacuum chamber unit 2 fitted with the plasma producing chamber 21 and the anode portion 11 can be cooled with water as well. When the main vacuum chamber unit 2 is closed, its internal space as well as the plasma treatment space 13 and the plasma producing spaces 22 are also closed off. Then, the movable wall member 40 is lowered down to a point below the cathode portion 12 and, in this condition, a substrate 1 held in a horizontal position is introduced into the vacuum chamber 2-3 sideways and loaded on the top surface of the cathode portion 12. As soon as a substrate input port and other openings are closed, a vacuum pump 5 begins to create a vacuum. The vacuum is swiftly created within the vacuum chamber 2-3 because the gate valve 4a is still left in its open position at this point and there exist no variable valve 4.

The motor 44 is then run to raise the movable wall member 40 up to a point where the movable wall member 40 scarcely comes into contact with the anode portion 11, and when the supply of the plasma producing gas A through the plasma producing gas feeding channels 23 and the supply of the treatment gas B through the treatment gas inlets 15 are commenced as appropriate, the pressure within the plasma treatment space 13 is maintained at a proper level by a throttling portion 49 formed between the upper end of the movable wall member 40 and a bottom surface of the anode portion 11. Specifically, the vacuum pressure within the plasma treatment space 13 is detected by the vacuum gage 4b attached to the movable wall member 40, a control signal is generated by the PID control circuit 4c based on the difference between a measurement value of the vacuum gage 4b and a predefined target value, and the motor 44 runs to cause the ball screw 42 to extend or retract, thereby causing the movable wall member 40 to move upward or downward.

More particularly, when the degree of vacuum within the plasma treatment space 13 deteriorates and its internal absolute pressure becomes too high, the movable wall member 40 is driven to descend. This causes the throttling portion 49 to somewhat broaden so that the pressure within the plasma treatment space 13 swiftly drops to restore a specified pressure. On the contrary, when the degree of vacuum within the plasma treatment space 13 increases and its internal absolute pressure becomes too low, the movable wall member 40 is driven to ascend. This causes the throttling portion 49 to somewhat constrict so that the pressure within the plasma treatment space 13 swiftly rises to restore the specified pressure.

The vacuum pressure within the vacuum chamber is automatically controlled by the pressure control means which includes the movable wall member 40 and the wall member drive mechanism 41-44 as a pressure control mechanism to swiftly achieve the specified pressure in the above-described manner.

The throttling portion 49 is formed almost uniformly around an upper part of the plasma treatment space 13. Since the flow of fluid streams including gases passing through the throttling portion 49 shows almost the same state at every point of the throttling portion 49 in accordance with the difference between the pressure inside the plasma treatment space 13 and the pressure within an internal space of the vacuum chamber outside the plasma treatment space 13, the gas state of the gases within the plasma treatment space 13 becomes nearly symmetrical, exhibiting high uniformity. Furthermore, since such a controlled pressure condition is maintained even when a plasma has been formed within the plasma treatment space 13, the state of the cold plasma 10 during an etching process, which will be described below, also becomes nearly symmetrical, exhibiting high uniformity.

Preparatory operations for carrying out a plasma etching process on the substrate 1 which is loaded on the cathode portion 12 are complete at this point.

When the RF power supply 32 is activated subsequently, RF electromagnetic fields are applied to the plasma producing spaces 22 by way of the coils 24, causing electrons within the plasma producing gas A to produce intense motion. Held within the plasma producing spaces 22 for a prolonged period of time by the operation of the magnetic circuit formed by the permanent magnet pieces 25, the electrons in this stage move freely within the annular spaces, producing spiral motion, and excite the plasma producing gas A. This is how the high-density plasma 20 is produced. Since the electrons confined within the plasma producing spaces 22 contain high-energy electrons charged to 10 to 15 eV or over which would greatly contribute to the production of ion species (see the curve in alternate long and two short dashed line in FIG. 6A), the ratio of ion species constituents is high in the high-density plasma 20. The high-density plasma 20 which has expanded within the plasma producing spaces 22, especially its radical species constituents and ion species constituents, is swiftly carried into the plasma treatment space 13 due to expansion pressure.

When the RF power supply 31 is activated, an RF electric field is applied across the plasma treatment space 13 as well through the anode portion 11 and the cathode portion 12. Since there is no magnetic circuit in the plasma treatment space 13 for confining the electrons, a high-density plasma is not created, but only the cold plasma 10 is produced, even when the treatment gas B or else is excited. If only the output power of the RF power supply 31 is applied, the ratio of radical species constituents becomes higher in the cold plasma 10 because it contains a small number of electrons with energies of 10 to 15 eV or over. In the cold plasma 10 in this system, however, the actual ratio between the radical species constituents and ion species constituents settles to an intermediate value between the ratios in the cold plasma 10 and the high-density plasma 20 because the above-described high-density plasma 20 is mixed with the high-density plasma 20.

If the output power of the RF power supply 32 is increased, the number of electrons with energies of 10 to 15 eV or over within the plasma producing spaces 22 increases (see FIG. 6B), resulting in an increase in the amount of production of the high-density plasma 20. When it is mixed into the cold plasma 10, the ratio of ion species constituents in the cold plasma 10 is increased. On the contrary, if the output power of the RF power supply 32 is decreased, the number of electrons with energies of 10 to 15 eV or over within the plasma producing spaces 22 decreases (see FIG. 6C), resulting in a decrease in the amount of production of the high-density plasma 20. When it is mixed into the cold plasma 10, the ratio of ion species constituents in the cold plasma 10 is decreased.

If the output power of the RF power supply 32 is slightly decreased while increasing the output power of the RF power supply 31, the following results will be obtained. First, the density of electrons within the plasma treatment space 13 becomes higher and their energies shifts toward the high-energy side as the output of the RF power supply 31 is increased (see alternate long and short dashed line in FIG. 6D), resulting in an increase in the amount of cold plasma within the plasma treatment space 13. This causes an increase in the density of radicals within the plasma treatment space 13, as well as a slight increase in the ratio of ions within the plasma treatment space 13 at the same time. Next, a reduction in the output of the RF power supply 32 causes the density of electrons within the plasma producing spaces 22 to become lower and their energies to shift toward the low-energy side (see alternate long and two short dashed line in FIG. 6D). This causes a decrease in the amount of high-density plasma within the plasma producing spaces 22. As a consequence, the density of radicals and the ratio of ions within the plasma producing spaces 22 decrease. Since the high-density plasma originally contains a large amount of high-density constituents, even a small reduction in the output power of the RF power supply 32 causes a significant decrease in the ratio of ions. When the high-density plasma 20 of this kind is mixed into the cold plasma 10 within the plasma treatment space 13, the increase and the decrease in the ratio of ions are roughly offset by each other, although the density of radicals increases. In other words, the density of plasma in the cold plasma 10 is increased without any significant change in the ratio between the radical species constituents and ion species constituents. Likewise, if the outputs of the RF power supplies 31, 32 are increased or decreased in opposite directions, the plasma density in the cold plasma 10 is decreased.

The ratio between the radical species constituents and ion species constituents in the cold plasma 10 can easily be varied in a controlled manner as described above, and its variable range is so wide as to cover the variable ranges of almost all conventional models. (See FIG. 7. It is to be noted that FIG. 7 and FIGS. 6A–6D provide schematic representations for explaining qualitative and relative characteristics.) Thus, etching operation is carried out efficiently under optimum conditions for each etching process, or under conditions which have conventionally been difficult to achieve. (See point "a" in FIG. 7.)

If the optimum conditions have changed due to a change in the constituents of the treatment gas B, for instance, the outputs of the RF power supplies 31, 32 are properly adjusted. This adjustment can be performed automatically if its details are preset. After adjustment, the etching operation is carried out efficiently under the optimum conditions again. (See point "b" in FIG. 7.) It is therefore possible to always perform the etching operation in an efficient manner.

The problem that the treatment gas B is directly excited by the high-density plasma 20 and decomposed and ionized to an undesirable level is least likely to occur in this system. This is because the cross-sectional area of the plasma producing spaces 22 is far smaller than the cross-sectional area of the plasma treatment space 13 and the first ratio is extraordinarily smaller than the second ratio so that the high-density plasma 20 is swiftly sent out of the plasma producing spaces 22 to the plasma treatment space 13 and, in addition, the amount of gases flowing in a reverse direction from the plasma treatment space 13 back into the plasma producing spaces 22 is small.

When the etching operation is efficiently performed with a high-quality plasma in the aforementioned manner, the speed at which a reaction product is produced as a result of a reaction between the cold plasma 10 and the substrate 1, as well as the amount of such reaction product produced unit time, would increase. If this reaction product remains within the vacuum chamber, a reaction between the reaction product and the treatment gas, for instance, could occur, potentially causing a deterioration in the quality of plasma treatment. The reaction product is swiftly discharged without remaining within the plasma treatment space 13 even when its amount increases, because the region in which a gas pressure necessary for the plasma etching treatment is maintained is confined to a minimum space bounded by the anode portion 11, the cathode portion 12 and the movable wall member 40, and the internal space of the vacuum chamber surrounding that confined region is sufficiently evacuated to create a vacuum state.

The plasma etching treatment which is excellent in quality and processing speed is maintained thanks to the supply of the high-quality plasma from the plasma producing spaces, for instance, combined with quick discharging of the reaction product by the movable wall member, for instance.

A plasma deposition (CVD) system is now described below. Basically, this system may be of generally the same construction as described above except for such differences that the cathode and the anode constituting facing electrodes are replaced with each other, monosilane or other active gas is used as a treatment gas B, the pressure within the plasma treatment space is set to a slightly higher level (low degree of vacuum), and so forth.

The ratio between radical species constituents and ion species constituents in the cold plasma 10 can easily be varied in a controlled manner in this case as well, and its variable range is so wide as to cover the variable ranges of almost all conventional models. (See FIG. 8.)

Thus, deposition operation is carried out efficiently under optimum conditions for each deposition process, or under conditions which have conventionally been difficult to achieve. (see point "a" in FIG. 3.) This system has the same advantage as the earlier described system in that the deposition process can be carried out efficiently under the optimum conditions by properly adjusting the outputs of the RF Power supplies 31, 32 when the optimum conditions have changed due to a change in the constituents of the treatment gas B, for instance. Even when the deposition process is used for depositing a variety of materials, such as polysilicon, aluminum, tungsten or other metals, an oxide film or a nitride film, it is possible to freely select and set optimum deposition conditions in accordance with properties of the film to be deposited and other purposes and thereby perform a high-quality deposition process at high productivity, because the ratio between the radical species constituents and ion species constituents during the deposition process can be widely varied in the plasma deposition system of this invention.

Since the aforementioned plasma treatment systems have a wide variable range in which the ratio of ions within a plasma can be controllably varied and they cover almost all of the conventional plasma etching systems and plasma CVD systems as well as gaps between such conventional systems (See FIG. 9), it is possible to freely select and set optimum treatment conditions. As a consequence, it becomes possible to perform high-quality plasma treatment in an efficient manner.

Figure 10:
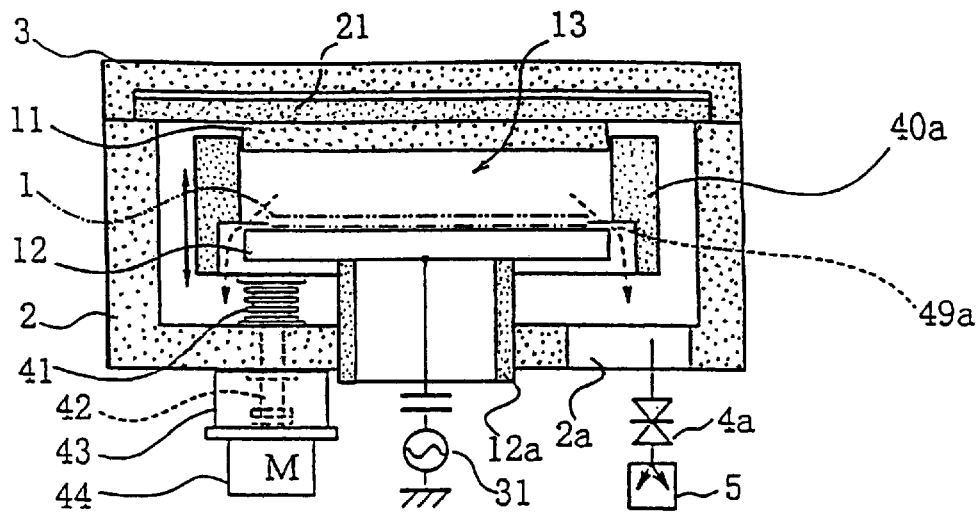
FIG. 10 is a cross-sectional diagram showing a first variation of a movable wall member.
Figure 11:
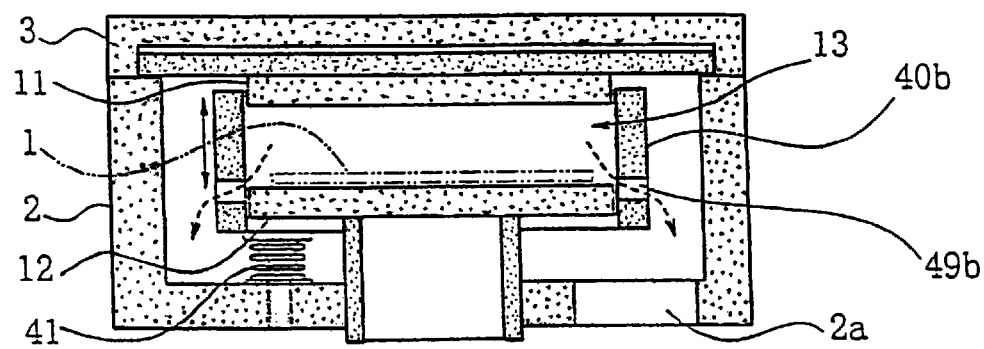
FIG. 11 is a cross-sectional diagram showing a second variation of the movable wall member.
Figure 12:
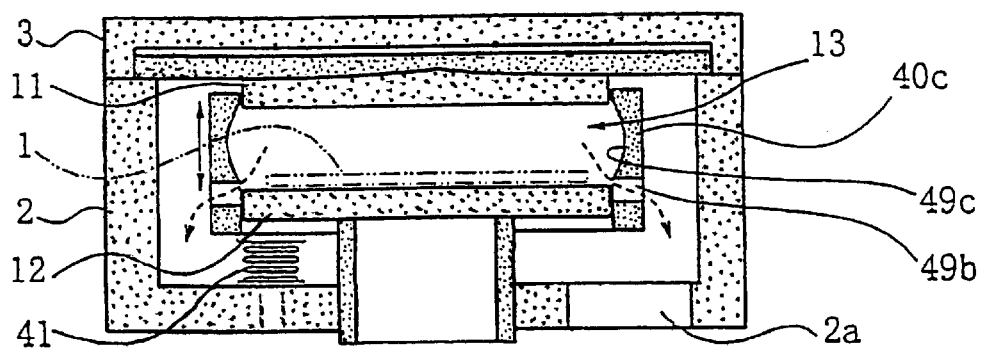
FIG. 12 is a cross-sectional diagram showing a third variation of the movable wall member.

Lastly, other examples of the construction of plasma treatment systems of this invention are explained. The plasma treatment systems shown in FIGS. 10 to 12 are various variations in which the movable wall member 40 of the earlier described system is modified. In any of these variations, the movable wall member 40 is formed into such a shape that creates a gap which will serve as a throttle for the flow of fluid streams between the movable wall member 40 and the cathode portion (substrate supporting structure) 12 when the movable wall member 40 is raised and located at a position where it covers the opening part of the plasma treatment space 13. The anode portion 11 is modified so that it has the same outside diameter as the cathode portion 12 and the anode portion 11 can also be fitted into the internal cavity of the movable wall member 40.

In a movable wall member 40a according to the first variation shown in FIG. 10, a lower part of its internal cavity is broadened in a steplike fashion, with the lowest end of the movable wall member 40a being supported by a ball screw 42 in such a way that the ball screw 42 and other components would not interfere with the cathode portion 12, and a throttling portion 49a acting on the fluid flow is formed between the lower end of a small-diameter part of the internal cavity and an upper peripheral part of the cathode portion 12.

In a movable wall member 40b according to the second variation shown in FIG. 11, a number of openings 49b are formed in the movable wall member 40b at a height corresponding to an upper peripheral part of the cathode portion 12, in which throttles are formed at these openings 49b in a dispersed fashion.

In a movable wall member 40c according to the third variation shown in FIG. 12, which also has a number of openings 49b, an internal side surface 49c of the movable wall member 40c is rounded in order to reduce angular edges in the plasma treatment space 13. This aims at relaxing the influence of nonuniformity which may be caused by a rapid change in fluid streams in the proximity of the openings 49b.

As is apparent from the above discussion, the present invention can provide basically the following four innovative plasma treatment systems.

The first plasma treatment system comprises a plasma treatment section in which a plasma treatment space is formed and a plasma producing section in which plasma producing spaces are formed, the plasma producing section being affixed to or formed as a single piece with the plasma treatment section, wherein the plasma producing spaces are located adjacent to and connected to the plasma treatment space and are formed in a dispersed or otherwise distributed fashion.

The second plasma treatment system has a pair of parallel plates which serve as facing electrodes in a vacuum chamber, and a plasma treatment space is formed between these parallel plates so that etching operation can be performed,, wherein plasma producing spaces which are located adjacent to and connected to the plasma treatment space are formed in a dispersed or otherwise distributed fashion in one of the pair of parallel plates or in its adjoining mechanism section.

In the first and second plasma treatment systems, an entire plasma space is divided into the plasma producing spaces and the plasma treatment space, in which the plasma producing spaces are formed in a dispersed or otherwise distributed fashion and are located adjacent to and connected to the plasma treatment space.

The above expression "in a dispersed or otherwise distributed fashion" refers not only to a configuration in which the plasma producing spaces are literally dispersed like scattered spots, but also to a configuration in which the plasma producing spaces are separated by some distances, not closely to one another, a configuration in which a plurality of plasma producing spaces are distributed in the form of lines, broken lines, straight or curved lines, or a mixture thereof in a portion adjacent to or connected to the plasma treatment space, as well as a configuration in which a number of plasma producing spaces shaped in annular, circular, polygonal or spiral form are arranged in concentric or nonconcentric arrays, or a single plasma producing space thus shaped is formed over a broad area.

In the first and second plasma treatment systems, the basic requirements for reducing plasma damage and charge-up and for achieving a proper ratio between radical species constituents and ion species constituents within a plasma are met by adhering to the prerequisites that the entire plasma space must be divided into separate spaces which are located adjacent to each other and interconnected.

Furthermore, since the plasma producing spaces are formed in a dispersed or otherwise distributed fashion, not only the requirements for ensuring the uniformity of plasma distribution are met, but the cross-sectional area of an adjoining surface between the plasma producing spaces and the plasma treatment space as well as that of the plasma producing spaces themselves taken along the adjoining surface naturally become smaller than the cross-sectional area of plasma treatment space. This is true not only for the whole cross section but also for partial cross sections of a central part and other parts. Defining a first ratio as the ratio of the area of the adjoining surface to the cross-sectional area of the plasma treatment space taken along the adjoining surface and a second ratio as the ratio of the area of the adjoining surface to the cross-sectional area of the plasma producing spaces taken along the adjoining surface, the first ratio is less than 1 and is smaller the second ratio when there is such a difference between the cross-sectional areas of the plasma treatment space and the plasma producing spaces.

When the first ratio is less than 1, the amount of gas following from the plasma treatment space into the plasma producing spaces decreases. On the other hand, when the second ratio is 1, the amount of gas flowing from the plasma producing spaces into the plasma treatment space does not decrease. Even when the second ratio is less than 1 and the amount of gas flowing into the plasma treatment space decreases, the decrease can be rather small if the second ratio larger than the first ratio. In any case, the proportion of the gas flowing from the plasma producing spaces into the plasma treatment space becomes relatively larger than the proportion of the gas flowing from the plasma treatment space into the plasma producing spaces. As a consequence, the counterflow of the undesirable gas into the plasma producing spaces is reduced. Moreover, even when the gas has flown into the plasma producing spaces, it is swiftly discharged back to the plasma treatment space together with plasma streams, and this makes it possible to avoid or decrease a change in gas properties caused by a high-density plasma.

Thus, the capability to achieve a proper plasma constituent ratio and controllability are positively increased by employing the aforementioned construction which prevents ion species from staying in the plasma producing spaces for a prolonged period of time by varying the ratio of the cross-sectional areas of the plasma producing spaces and the plasma treatment space. Furthermore, this construction can supply a high-quality plasma as it satisfies the requirements for both ensuring the uniformity of plasma distribution and preventing the gas from flowing from the plasma treatment space into the plasma producing spaces. As a consequence, it is made possible to perform high-density etching operation.

The third plasma treatment system has a pair of parallel plates which serve as facing electrodes in a vacuum chamber, and a plasma treatment space is formed between these parallel plates so that etching operation can be performed. Plasma producing spaces which are located adjacent to and connected to the plasma treatment space are formed in one of the pair of parallel plates or in its adjoining mechanism section. The plasma producing spaces are associated with a magnetic circuit, at least part of magnetic elements for creating the magnetic circuit being disposed in a region surrounded or sandwiched by the plasma producing spaces.

In the third plasma treatment system, the basic requirements for reducing plasma damage and charge-up and for achieving a proper ratio between radical species constituents and ion species constituents within a plasma are met by adhering to the prerequisites that the entire plasma space must be divided into separate spaces which are located adjacent to each other and interconnected.

Furthermore, electrons which contribute to the creation of the plasma and its ionization is confined within the plasma producing spaces by the magnetic circuit. Since at least part of the magnetic elements is disposed in a region surrounded or sandwiched by the plasma producing spaces, the magnetic circuit is localized. Thus, lines of magnetic force are confined within a condensed distribution so that leakage flux is reduced.

Consequently, the electrons are securely confined within the plasma producing spaces, and it becomes less likely that the electrons would go astray into the plasma treatment space randomly ionize a cold plasma there or the undesirable treatment gas would enter from the plasma treatment space into the plasma producing spaces instead of the electrons. This means that uncontrollable mixing is reduced in this system, As a result, it becomes possible to control the ratio of ion species constituents contained in the plasma to achieve a proper ratio throughout a wide range by feeding a proper amount of plasma of a high ratio of ion species into the plasma treatment space and mixing it with a plasma of a low ratio of ion species in the plasma treatment space.

The localized magnetic circuit, if it is constructed in a parallel configuration, for example, would also serve to meet the requirement for the uniformity of plasma. Moreover, the localization of the magnetic circuit is advantageous in that individual magnetic elements used for creating the magnetic circuit may be of a small and simple type which is easy to install, because the magnetic force produced by the whole magnetic circuit may be weak as a result of the localization. Further, a combination of this localized magnetic circuit with the aforementioned construction in which the plasma producing spaces are formed in a dispersed or otherwise distributed fashion would potentially produce such a combined effect that the undesirable gas which has flown in a reverse direction into the plasma producing spaces and ionized is swiftly returned to the plasma treatment space together with the high-density plasma before the properties of such undesirable gas are further changed.

Thus, the capability to achieve a proper plasma constituent ratio and controllability are positively increased under specific preconditions. Furthermore, the above construction can supply a high-quality plasma as it satisfies the requirements for both ensuring the uniformity of plasma distribution and preventing the gas from flowing from the plasma treatment space into the plasma producing spaces. As a consequence, it is possible to allow high density etching operation.

The fourth plasma treatment system has a pair of parallel plates which serve as facing electrodes in a vacuum chamber, and a plasma treatment space is formed between these parallel plates so that etching operation can be performed. Plasma producing spaces which are located adjacent to and connected to the plasma treatment space are formed in a dispersed or otherwise distributed fashion in one of the pair of parallel plates or in its adjoining mechanism section, and the plasma producing spaces are associated with a magnetic circuit for confining electrons.

The fourth plasma treatment system possesses advantageous effects of the aforementioned second and third plasma treatment systems. More specifically, the capability to achieve a proper plasma constituent ratio and controllability are positively increased and this construction can satisfy the requirements for both ensuring the uniformity of plasma distribution and preventing the gas from flowing from the plasma treatment space into the plasma producing spaces, because the aforementioned construction prevents ion species from staying in the plasma producing spaces for a prolonged period of time by varying the ratio of the cross-sectional areas of the plasma producing spaces and the plasma treatment space and securely confines the electrons within the plasma producing spaces. An advantageous effect accomplished as a result is that it has been possible to realize a plasma treatment system which can supply a high-density plasma.

Furthermore, the fourth plasma treatment system may be constructed such that the aforementioned plasma producing spaces are formed in linear form and a number of magnetic elements for creating the magnetic circuit are arranged in arrays sandwiching each plasma producing space from both sides.

In this type of plasma treatment system, although the plasma producing spaces are dispersed or otherwise distributed, they are formed rather continuously and, therefore, they provide a reasonably high capacity compared to the configuration in which the plasma producing spaces are dispersed in the form of scattered spots. Especially when the plasma producing spaces are configured in a spiral form, they have the unity as a single space. Thus, even when the plasma producing spaces are dispersed or otherwise distributed, the plasma within these spaces is made considerably uniform. Furthermore, the plasma producing spaces may be arranged in multiple annular form or multiple rectangular form, or such multiple arrays may be partially interconnected, and this makes it easy to disperse the plasma producing spaces to create a configuration suited to the shape of a particular substrate to be treated while maintaining the unity of the configuration. When the configuration of the plasma producing spaces has been determined, the magnetic circuit can be created by arranging small magnet pieces on both sides of each plasma producing space so that electrons can easily be confined within the plasma producing spaces. This makes it easy to create the magnetic circuit. Since the plasma producing spaces are distributed while maintaining the unity of their configuration, it becomes possible to achieve the uniformity of the produced plasma and facilitate the design and production of the magnetic circuit.

In the third and fourth plasma treatment systems, the magnetic circuit may be formed by means of permanent magnets or an exciting coil. Since a high-power electromagnet is not required in this type of plasma treatment system, component mounting design becomes easier and the system can be made smaller. Moreover, production costs are reduced because not only is the high-power electromagnet required, but a high-capacity power supply for driving the high-power electromagnet becomes unnecessary. Especially when the permanent magnets are employed, they can be adapted to various magnetic circuit configurations only by arranging small magnet pieces of the same or similar shapes. This will not only help reduce the production costs but provide a significant improvement in the flexibility of design. Elimination of the need for the high-power electromagnet has provided such advantageous effects as simplification of design, reduction in size of the system, and cost reduction.

Furthermore, the first, second, third and fourth plasma treatment systems may be provided with a first field application circuit for applying an electric field or a magnetic field which contributes to the production or enhancement of plasma to the plasma treatment space and a second field application circuit for applying an electric field or a magnetic field which contributes to the production and enhancement of plasma to the plasma producing spaces. In this type of plasma treatment system, it becomes possible to controllably vary not only the ratio of ion species constituents in the plasma by altering the output power of the first field application circuit but also the plasma density without varying the ratio of ion species constituents in the plasma by also altering the output power of the second field application circuit. This makes it possible to set the plasma constituent ratio and the plasma density independently of each other.

Furthermore, the output power of the first field application circuit and that of the second field application circuit may be made independently controllable of each other. Here, the expression "independently controllable of each other" means that the outputs of the two circuits can be varied independently of each other if it is so desired, and does not mean that the two circuits can be adjusted regardless of the contents of control operation. Even when a certain coefficient or a mathematical function is preset and the outputs of the two circuits are related to each other by the coefficient or mathematical function, for example, the outputs are regarded as being independently controllable if the individual circuits adjust their outputs to match their respective target values based on the coefficient or mathematical function. In this type of plasma treatment system, the output power of the individual application circuits is controlled independently of each other and, as a consequence, the plasma constituent ratio and the plasma density are set independently of each other. Stated another way, the density of ion species and the density of radical species are controlled and set independently of each other. Since treatment conditions can be arbitrarily chosen within a wide range of settings, it is possible to further improve the efficiency and quality of plasma treatment.

Furthermore, the first, second, third and fourth plasma treatment systems may be constructed such that the sectional area of a region connected to or opening to the plasma treatment space is smaller than the area of a cross section of the plasma producing spaces taken parallel to the aforementioned pair of parallel plates. Since each connecting part between the plasma producing spaces and the plasma treatment space is constricted and the first ratio becomes smaller compared to a configuration in which the plasma producing spaces are made to simply open to the plasma treatment space in this type of plasma treatment system, the flow of undesirable gas into the plasma producing spaces is further reduced. In addition, since a plasma which has occurred and expanded within the plasma producing spaces is delivered to the plasma treatment space at a proper rate in accordance with the area ratio, it is possible to additionally control a velocity component in a vertical direction of the plasma, especially of its ion species constituents.

Furthermore, the first, second, third and fourth plasma treatment systems may be provided with a first gas intake channel for introducing a plasma producing gas into the plasma producing spaces and a second gas intake channel for introducing a treatment gas into the plasma treatment space. In this type of plasma treatment system, the plasma producing gas is introduced into the plasma producing spaces through the first gas intake channel while the treatment gas is introduced into the plasma treatment space through the separate second gas intake channel. Thus, the plasma producing gas necessary for the production of the high-density plasma and the treatment gas which will cause an undesirable effect when mixed into the high-density plasma are separated from each other. What is particularly important is that the treatment gas is supplied to the plasma treatment space without passing through the plasma producing spaces, and the two kinds of gases are mixed only when a final stage has been reached. With this arrangement, it is possible to reliably prevent the treatment gas from being changed in properties by high-density plasma before the treatment gas is actually used for plasma treatment.

Furthermore, the above plasma treatment systems may be such that only a gas containing a reactive gas constituent is supplied to the second gas intake channel whereas a gas containing a non-reactive gas constituent is supplied to the first gas intake channel. In this type of plasma treatment system, the treatment gas contains the reactive gas constituent necessary for etching operation while only the non-reactive gas constituent, which is useful for the production of the high-density plasma but will not be undesirably changed in properties even when the high-density plasma has been produced, is used. With this arrangement, it is possible to supply a higher-quality plasma compared to the configuration in which a reactive gas is supplied through the plasma producing spaces. Moreover, it is possible to produce a desired amount, e.g., large quantities, of high-density plasma and ion species without worrying about the change in properties of the reactive gas Furthermore, the second, third and fourth plasma treatment systems may be provided with a movable wall member having such a shape that covers an opening part of the plasma treatment space defined with reference to the pair of parallel plates and a wall member drive mechanism for moving the movable wall member all the way between a position where the movable wall member covers the opening part and a position where the movable wall member uncovers the opening part, wherein one of the pair of parallel plates is installed directly on an internal bottom surface of the vacuum chamber or indirectly by way of a support member and has such a top surface that is shaped to allow a substrate to be loaded.

Here, the "opening part of the plasma treatment space defined with reference to the pair of parallel plates" stated above refers to a side portion of a cylinder-shaped space whose both ends are defined by the two parallel plates. Also, the expression "covers the opening part" means that the opening part is covered leaving a gap which will allow at least such portion of the plasma and gases that have already been used for treatment to be discharged but hold the remaining portion of the plasma, rather than completely closing off the opening part.

In this type of plasma treatment system, the substrate is loaded-on the top surface of one of the parallel plates, the plasma treatment space is created above the substrate, and the plasma treatment is performed on the substrate in the plasma treatment space. Since the opening part of the plasma treatment space is covered by the movable wall member, the plasma treatment space is nearly enclosed by the pair of parallel plates and the movable wall member within the vacuum chamber. Part of the internal space of the vacuum chamber is then set apart as the plasma treatment space, and pressure conditions inside and outside the plasma treatment space are almost separated from each other. The degree of this pressure separation depends on the size of the gap left which is not covered by the movable wall member.

When the movable wall member is moved by the wall member drive mechanism, the gap is broadened or narrowed, causing the pressure within the plasma treatment space to swiftly approach the vacuum pressure within the vacuum chamber or increase and go away from the vacuum pressure. Thus, it becomes possible to control the pressure condition of the plasma in accordance with movements of the movable wall member. If the shape of the movable wall member is matched with that of the parallel plates and the gap between them is thereby made as uniform as possible, unevenness of fluid flow flowing out of the plasma treatment space will be reduced.

The movable wall member can be retracted by the wall member drive mechanism up to a position where the opening part of the plasma treatment space is uncovered when introducing the substrate into or removing it out of the vacuum chamber. Thus, the provision of the movable wall member within the vacuum chamber does not produce any disadvantage.

With this arrangement, the direct object of pressure control operation has changed from the internal pressure of the vacuum chamber to that of the plasma treatment space which constitutes only part of the vacuum chamber, or from a large-capacity object with poor response to a small-capacity object with superior response. On the other hand, characteristics of the fluid flow are no longer controlled by an intake opening in the wall of the vacuum chamber. Instead, the characteristics of the fluid flow are almost completely determined by the movable wall member by which a uniform distribution, such as symmetrical distribution around a middle point, can be achieved relatively easily. Thus, it becomes easier to improve pressure controllability within the plasma treatment space and achieve a uniform flow in the plasma treatment space at the same time. It is therefore possible to realize a plasma treatment system having the capability to supply a uniform and high-quality plasma as well as excellent pressure controllability by employing the aforementioned arrangement, in which the object of pressure control operation has changed from the internal pressure of the large-capacity vacuum chamber to that of the small-capacity plasma treatment space, and the characteristics of the fluid flow are no longer controlled by the intake opening in the wall of the vacuum chamber but are made dependent on the movable wall member which facilitates a uniform flow distribution.

Further, the shape of the movable wall member may be such that a gap which will serve as a throttle acting on a fluid flow is created between the movable wall member and the aforementioned one parallel plate when the movable wall member is in the position where it covers the opening part. In this type of plasma treatment system, the treatment gas and other gases supplied from one side where one parallel plate on which the substrate is not loaded usually flow out of the plasma treatment space not along the same parallel plate but through a gap created around the other parallel plate during plasma treatment. For this reason, the flow tends to be aligned from top to bottom. This makes it possible to prevent the gases from flowing in a reverse direction and from staying in the plasma treatment space for a prolonged time period. It is therefore possible to further enhance the uniformity of the state of the plasma by employing-the aforementioned arrangement, in which the flow is aligned in the same direction.

Furthermore, there may be provided pressure control means for controlling the amount of movement of the movable wall member caused by the wall member drive mechanism in accordance with the pressure within the plasma treatment space. In this type of plasma treatment system, the pressure within the plasma treatment space is automatically controlled by the pressure control means so that a desired vacuum pressure is obtained. Since this automatic control operation is performed by controlling the amount of movement of the movable wall member which has good pressure controllability over the plasma treatment space, the state of the plasma swiftly and accurately follows a target value preset in the plasma treatment system. With this arrangement, a preset plasma reaction is performed in a reliable manner even when more detailed treatment conditions than before are set. It is therefore possible to perform more accurately controlled plasma treatment on the substrate.

The plasma treatment system of this invention is generally installed in an appropriate vacuum chamber when it is actually used. For this reason, one of the parallel plates between which the plasma treatment space adjacent to the plasma producing spaces is formed and its adjoining mechanism- section and other mechanisms are individually produced and assembled together, e.g., firmly fixed in tight contact with each other, in most cases from the viewpoint of balancing between the ease of installation into the vacuum chamber and the need of a high degree of vacuum. Part or the entirety of such components may be formed as a one-piece element by machining a single raw material such as a clad material.

While the invention has been described by way of examples with reference to the accompanying drawings, various variations and modifications will be apparent to those skilled in the art. Accordingly, all such variations and modifications are intended to be covered by the scope of the invention as long as they do not depart from the objects of the invention.

What is claimed is:

1. A plasma treatment system in which a plasma treatment space is formed between a pair of parallel plates which serve as facing electrodes, wherein plasma producing spaces which are located adjacent to and connected to said plasma treatment space are formed in a dispersed or otherwise distributed fashion in one of said pair of parallel plates or in its adjoining mechanism section, and further wherein the sectional area of a region connected to or opening to said plasma treatment space is smaller than the sectional area of said plasma producing spaces.

2. A plasma treatment system in which a plasma treatment space is formed between a pair of parallel plates which serve facing electrodes, wherein plasma producing spaces which are located adjacent to and connected to said plasma treatment space are formed in a dispersed or distributed fashion in one of said pair of parallel plates or in its adjoining mechanism section, and said plasma producing spaces are associated with a magnetic circuit, magnetic elements for creating the magnetic circuit being disposed in a region surrounded or sandwiched by said plasma producing spaces, wherein the sectional area of a region connected to or opening to said plasma treatment space is smaller than the sectional area of said plasma producing spaces.

3. A plasma treatment system in which a plasma treatment space is formed between a pair of parallel plates which serve as facing electrodes, wherein plasma producing spaces which are located adjacent to and connected to said plasma treatment space are formed in a dispersed or otherwise distributed fashion in one of said pair of parallel plates or in its adjoining mechanism section, and said plasma producing spaces are associated with a magnetic circuit for confining electrons, and further wherein the sectional area of a region connected to or opening to said plasma treatment space is smaller than the sectional area of said plasma producing spaces.

4. A plasma treatment system in which a plasma treatment space is formed between a pair of parallel plates which serve as facing electrodes, wherein plasma producing spaces which are located adjacent to and connected to said plasma treatment space are formed in a dispersed or distributed fashion in one of said pair of parallel plates or in its adjoining mechanism section, further comprising:

a movable wall member configured to be able to cover an opening part of said plasma treatment space defined with reference to said pair of parallel plates;

a wall member drive mechanism for moving said movable wall member all the way between a first position where said movable wall member covers the opening part and a second position where said movable wall member uncovers the opening part; and a closed chamber including therein said movable wall member and said pair of parallel plates;

wherein one of said pair of parallel plates is installed on an internal bottom surface of said chamber and has a top surface shaped to allow a substrate to be located thereon.

5. A plasma treatment system as defined in claim 4, further wherein the shape of said movable wall member is such that a gap serving as a throttle acting on a fluid flow is created between said movable wall member and said one of the parallel plates installed on the internal bottom surface of said chamber when said movable wall member is in the first position.

6. A plasma treatment system as defined in claim 4 provided with pressure control means for controlling the amount of movement of said movable wall member caused by said wall member drive mechanism in accordance with the pressure within said plasma treatment space.

7. A plasma treatment system in which a plasma treatment space is formed between a pair of parallel plates which serve as facing electrodes, wherein plasma producing spaces which are located adjacent to and connected to said plasma treatment space formed in a dispersed or distributed fashion in one of said pair of parallel plates or in its adjoining mechanism section, and said plasma producing spaces are associated with a magnetic circuit, magnetic elements for creating the magnetic circuit being disposed in a region surrounded or sandwiched by said plasma producing spaces, further comprising:
- a movable wall member configured to be able to cover an opening part of said plasma treatment space defined with reference to said pair of parallel plates;
- a wall member drive mechanism for moving said movable wall member all the way between a first position where said movable wall member covers the opening part and a second position where said movable wall member uncovers the opening part; and
- a closed chamber including therein said movable wall member and said pair of parallel plates;
- wherein one of said pair of parallel plates is installed on an internal bottom surface of said chamber and has a top surface shaped to allow a substrate to be located thereon.

8. A plasma treatment system as defined in claim 7, further wherein the shape of said movable wall member is such that a gap serving as a throttle acting on a fluid flow is created between said movable wall member and said one of the parallel plates installed on the internal bottom surface of said chamber when said movable wall member is in the first position.

9. A plasma treatment system as defined in claim 7 provided with pressure control means for controlling the amount of movement of said movable wall member caused by said wall member drive mechanism in accordance with the pressure within said plasma treatment space.

10. A plasma treatment system in which a plasma treatment space is formed between a pair of parallel plates which serve as facing electrodes, wherein plasma producing spaces which are located adjacent to and connected to said plasma treatment space are formed in a dispersed or distributed fashion in one of said pair of parallel plates or in its adjoining mechanism section, and said plasma producing spaces are associated with a magnetic circuit for confining electrons, further comprising:
- a movable wall member configured to be able to cover an opening part of said plasma treatment space defined with reference to said pair of parallel plates;
- a wall member drive mechanism for moving said movable wall member all the way between a first position where said movable wall member covers the opening part and a second position where said movable wall member uncovers the opening part; and
- a closed chamber including therein said movable wall member and said pair of parallel plates;
- wherein one of said pair of parallel plates is installed on an internal bottom surface of said chamber and has a top surface shaped to allow a substrate to be located thereon.

11. A plasma treatment system as defined in claim 10, further wherein the shape of said movable wall member is such that a gap serving as a throttle acting on a fluid flow is created between said movable wall member and said one of the parallel plates installed on the internal bottom surface of said chamber when said movable wall member is in the first position.

12. A plasma treatment system as defined in claim 10 provided with pressure control means for controlling the amount of movement of said movable wall member caused by said wall member drive mechanism in accordance with the pressure within said plasma treatment space.

13. A plasma treatment system, comprising:
- a plasma treatment section in which a plasma treatment space is formed;
- a plasma producing section in which plasma producing spaces are formed, wherein
  said plasma producing section is affixed to or formed as a single piece with said plasma treatment section and said plasma producing spaces are formed as concentric annular grooves each connected to said plasma treatment space;
- a first gas intake channel configured to introduce a plasma producing gas into said plasma producing spaces; and
- a second gas intake channel configured to introduce a treatment gas into said plasma treatment space.

14. The plasma treatment system as defined in claim 13, wherein the cross-sectional area of said plasma producing spaces taken along an adjoining surface between said plasma producing spaces and said plasma treatment space is made smaller than the cross-sectional area of said plasma treatment space taken along said adjoining surface.

15. The plasma treatment system as defined in claim 13 provided with a first field application circuit for applying an electric field or a magnetic field which contributes to the production or enhancement of plasma to said plasma treatment space and a second field application circuit for applying an electric field or a magnetic field which contributes to the production and enhancement of plasma to said plasma producing spaces.

16. The plasma treatment system as defined in claim 15 wherein the output power of said first field application circuit and that of said second field application circuit are independently controllable of each other.

17. The plasma treatment system as defined in claim 13 wherein the sectional area of a region connected to or opening to said plasma treatment space is smaller than the sectional area of said plasma producing spaces.

18. The plasma treatment system as defined in claim 13 wherein only a gas containing a reactive gas constituent is supplied to said second gas intake channel whereas a gas containing a non-reactive gas constituent is supplied to said first gas intake channel.

19. The plasma treatment system as defined in claim 13 wherein said plasma treatment system is a deposition treatment system/etching treatment system.

* * * * *